US012684879B2

(12) United States Patent
Kanematsu

(10) Patent No.: US 12,684,879 B2
(45) Date of Patent: Jul. 14, 2026

(54) SOLID STATE IMAGE SENSOR AND METHOD OF MANUFACTURING SOLID STATE IMAGE SENSOR

(71) Applicant: Sony Semiconductor Solutions Corporation, Kanagawa (JP)

(72) Inventor: Shigeru Kanematsu, Kangawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 460 days.

(21) Appl. No.: 18/548,411

(22) PCT Filed: Feb. 16, 2022

(86) PCT No.: PCT/JP2022/006156
§ 371 (c)(1),
(2) Date: Aug. 30, 2023

(87) PCT Pub. No.: WO2022/215360
PCT Pub. Date: Oct. 13, 2022

(65) Prior Publication Data
US 2024/0145495 A1 May 2, 2024

(30) Foreign Application Priority Data
Apr. 8, 2021 (JP) ................................. 2021-066015

(51) Int. Cl.
*H10F 39/00* (2025.01)
*H10F 39/18* (2025.01)
(52) U.S. Cl.
CPC ......... *H10F 39/802* (2025.01); *H10F 39/014* (2025.01); *H10F 39/18* (2025.01)

(58) Field of Classification Search
CPC ............. H10D 89/013; H10D 89/0133; H10D 62/149; H10D 84/017; H10F 39/802; H10F 39/014; H10F 39/18; H10F 39/12; H10F 39/8037; H10F 39/80373; H10F 39/80377
See application file for complete search history.

(56) References Cited

FOREIGN PATENT DOCUMENTS

| | | |
|---|---|---|
| JP | 2006086241 A | 3/2006 |
| JP | 2008166607 A | 7/2008 |
| JP | 2008263037 A | 10/2008 |
| JP | 2011014808 A | 1/2011 |
| JP | 2011049446 A | 3/2011 |
| JP | 2011071347 A | 4/2011 |
| JP | 2014072485 A | 4/2014 |
| JP | 2021034496 A | 3/2021 |

OTHER PUBLICATIONS

International Search Report (PCT/ISA/210), International Application No. PCT/JP2022/006156, dated May 17, 2022.

*Primary Examiner* — Tucker J Wright
(74) *Attorney, Agent, or Firm* — Michael Best & Friedrich LLP

(57) ABSTRACT

A solid state image sensor according to an embodiment includes a transfer gate, a floating diffusion portion that converts signal charge transferred from a photodiode via the transfer gate into a voltage signal, and an extraction electrode that is formed of a film of conductive material including any of amorphous silicon, monocrystalline silicon, or N+ polysilicon, that has a peripheral edge portion surrounded by a film of insulating material and one end electrically connected to the floating diffusion portion, and that transmits the voltage signal.

3 Claims, 14 Drawing Sheets (A)

(B)

(A)

(B)

(A)

(B)

(A)

(B)

(A)

(B)

SOLID STATE IMAGE SENSOR AND METHOD OF MANUFACTURING SOLID STATE IMAGE SENSOR

FIELD

The present disclosure relates to a solid state image sensor and a method of manufacturing a solid state image sensor.

BACKGROUND

As a conventional solid state imaging device, a CMOS solid state imaging device is known that uses a CMOS image sensor used for various mobile terminal devices and the like such as a digit still camera, a digital video camera, and a mobile phone with a camera, due to low power supply voltage and low power consumption.

For pixel miniaturization in an image sensor, it is necessary to reduce the area of a floating diffusion portion to which charge is transferred via a gate terminal TG, in order to secure the area of a photodetector (PD) region. However, due to limitations in existing process technology, the reduction in the area of the floating diffusion portion is limited.

In addition, for achievement of high conversion efficiency, it is necessary to reduce the capacity of the floating diffusion portion. However, if the floating diffusion portion is formed by conventional ion implantation may cause a problem that the ion implantation has a small mean projected range Rp and variation in the thickness of a buffer film in the ion implantation causes variation in implantation depth.

CITATION LIST

Patent Literature

Patent Literature 1: JP 2011-071347 A

SUMMARY

Technical Problem

In the conventional technology described above, a contact needs to be provided on an N+ region formed. Therefore, the size of a space between a transfer gate TG and a sidewall SW is limited clue to a margin for alignment of the contact, which restricts the reduction of the area of the floating diffusion portion.

In addition, it is necessary to form an opening on the region of the floating diffusion portion to draw the charge upward by the metal contact and restriction on a mask size for forming the metal contact restricts the reduction of the area of the floating diffusion portion.

Therefore, an object of the present invention is to provide a solid state image sensor and a method of manufacturing a solid state image sensor that facilitate forming a metal contact while reducing the area of a floating diffusion portion without being restricted by a margin for alignment of the contact and a mask size for forming the metal contact.

Solution to Problem

A solid state image sensor of the embodiment includes: a transfer gate; a floating diffusion portion that converts signal charge transferred from a photodiode via the transfer gate into a voltage signal; and an extraction electrode that is formed of a film of conductive material including any of N-type polysilicon, amorphous silicon, or monocrystalline silicon, that has a peripheral edge portion surrounded by a film of insulating material and one end electrically connected to the floating diffusion portion, and that transmits the voltage signal.

DESCRIPTION OF EMBODIMENTS

First, embodiments will be described in detail below with reference to the drawings.

[1] First Embodiment

In the present first embodiment, a solid state image sensor shared by four pixels in which one floating diffusion portion is shared by four photodiodes will be described as an example.

Figure 1:
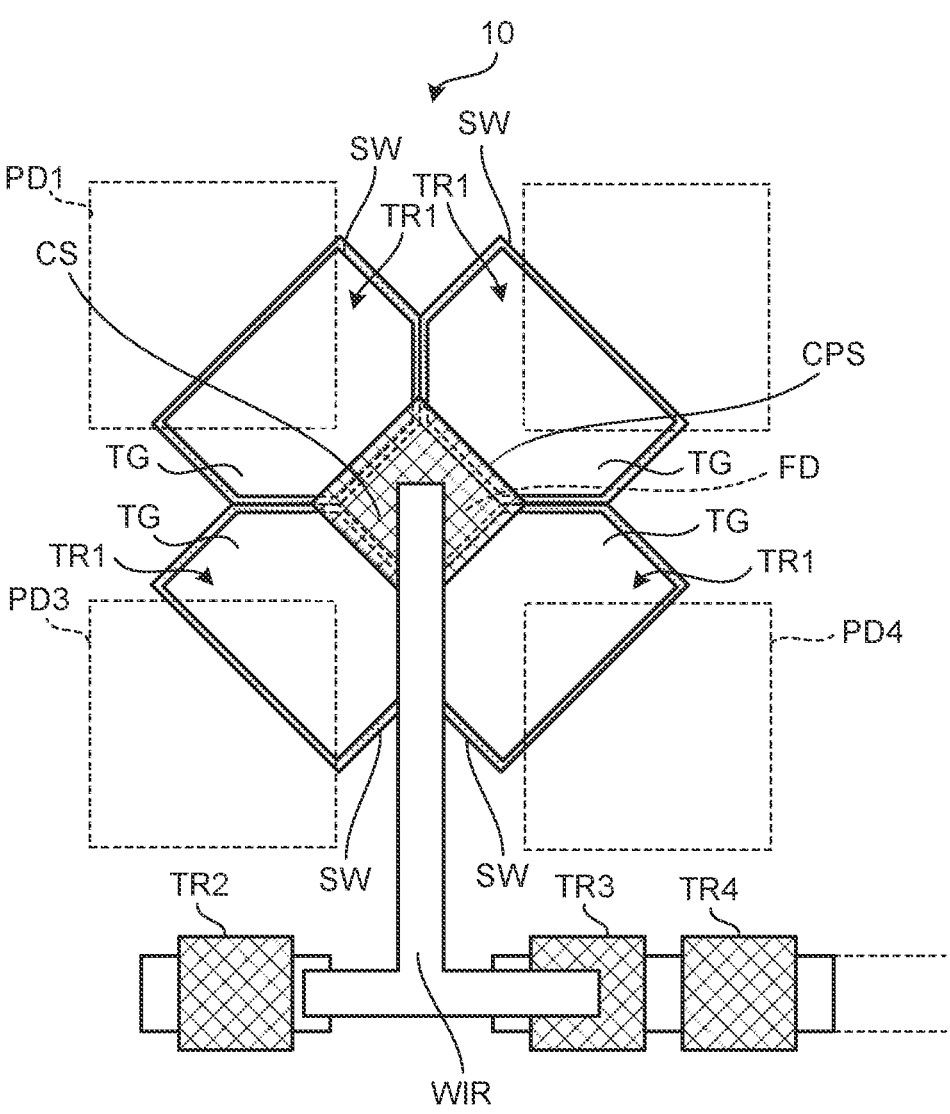
FIG. 1 is a plan view of a main portion of a solid state imaging device shared between four pixels.

FIG. 1 is a plan view of a main portion of the solid state image sensor shared between four pixels.

In the solid state image sensor 10, photodetectors PD1 to PD4 of a total of four pixels of two vertical pixels and two horizontal pixels are set as one sharing unit (so-called sharing between four pixels), and the one sharing unit is arranged in a two-dimensional array to form a pixel area.

The four photodetectors PD1 to PD4 share one floating diffusion portion FD.

Furthermore, a transfer transistor TR1 (four transfer transistors for four pixels) that corresponds to each pixel, and one reset transistor TR2, one amplification transistor TR3, and one selection transistor TR4 that are transistors shared by the four pixels are provided as a pixel transistor.

The floating diffusion portion FD is arranged at the center surrounded by the four photodetectors PD1 to PD4. Each transfer transistor Tr1 has a transfer gate TG arranged between the common floating diffusion portion FD and each corresponding photodetector PD.

The transfer gate TG is surrounded by a sidewall SW formed of an insulating film (e.g., SiO2).

Furthermore, a region surrounded by the outer peripheral surface of the sidewall is provided with an extraction electrode CPS that is electrically connected to the floating diffusion portion FD and that is formed of a film of conductive material (e.g., poly Si, amorphous silicon, monocrystalline silicon, or the like).

Furthermore, metal wiring WIR is electrically connected to a contact surface CS formed on the upper surface of the extraction electrode CPS, and is connected to the reset transistor TR2 and the amplification transistor TR3.

Figure 2:
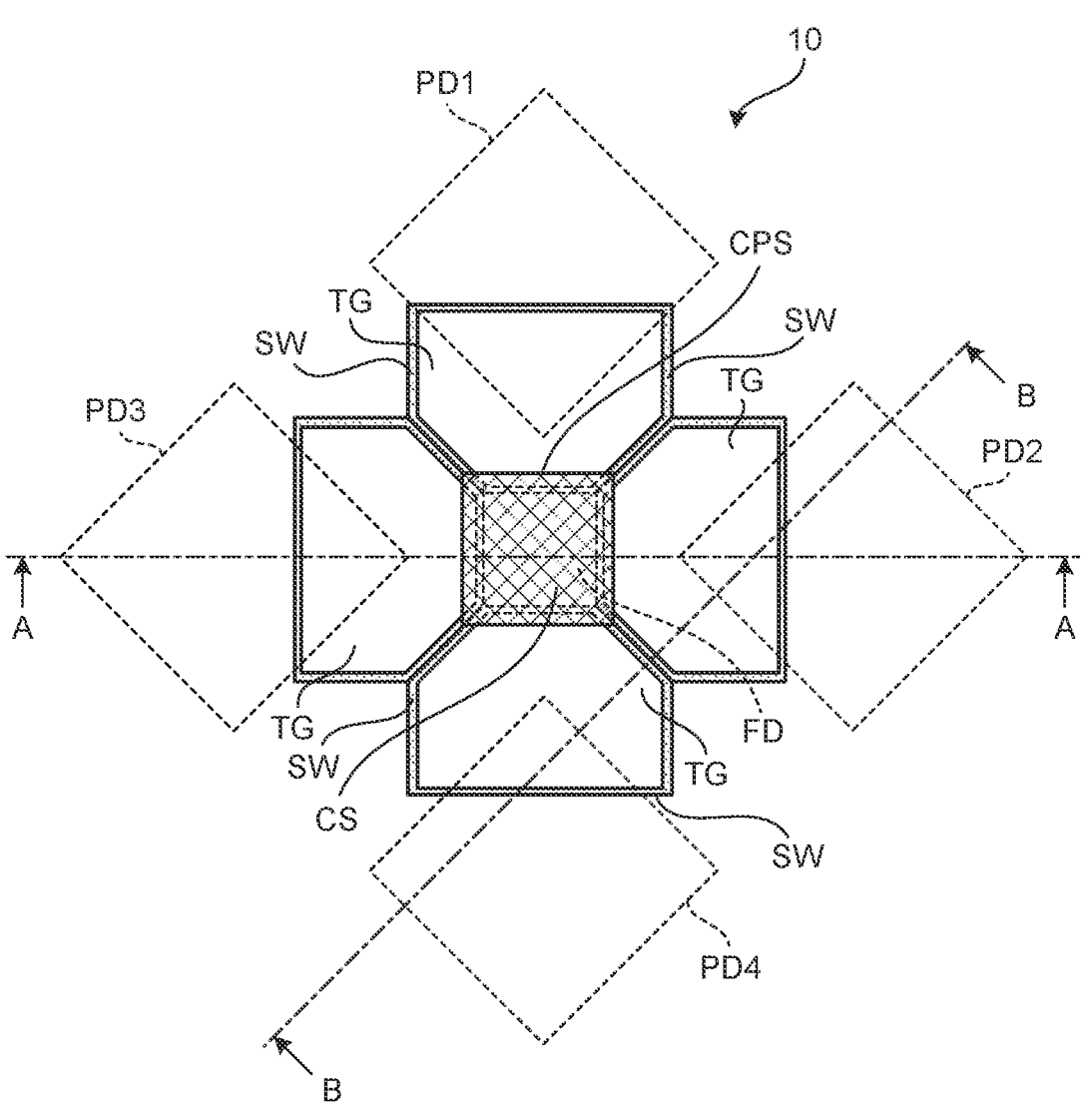
FIG. 2 is an illustrative diagram illustrating a cross-sectional position.

FIG. 2 is an illustrative diagram illustrating a cross-sectional position.

In the following description, when a cross-sectional view is illustrated, a cross-sectional view taken along line A-A passing through the center portion of the floating diffusion portion FD and a cross-sectional view taken along line B-B passing through portions of the transfer gates TG without passing through the floating diffusion portion FD are shown, as illustrated in FIG. 2.

Figure 3:
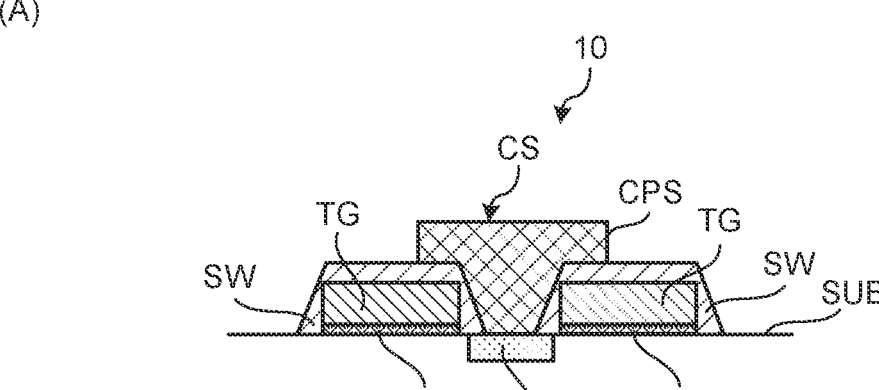
FIG. 3 illustrates cross-sectional views of an image sensor according to a first embodiment.
Figure 3:
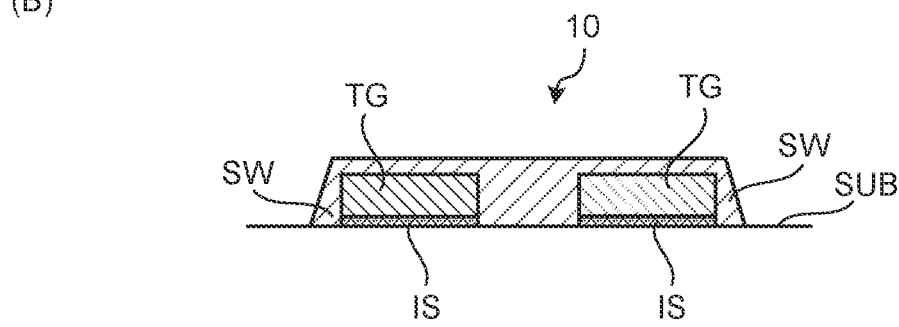

FIG. 3 illustrates cross-sectional views of the solid state image sensor according to the first embodiment.

FIG. 3(A) is a cross-sectional view taken along line A-A of the solid state image sensor of the first embodiment, and FIG. 3(B) is a cross-sectional view taken along line B-B of the solid state image sensor of the first embodiment.

As illustrated in FIGS. 3(A) and 3(B), in the image sensor 10 of the first embodiment, a pair of transfer gates TG are formed on a substrate SUB via a film IS of insulating material.

A so-called sidewall SW made of an insulating material (e.g., SiO2) is formed on the peripheral surfaces of each transfer gate TG, and an insulating film made of the same material as that of the sidewall SW is also formed on an upper surface (upper surface in FIG. 3) of each transfer gate TG.

Furthermore, the extraction electrode CPS made of a film of conductive material (e.g., N+ Poly Si [N-type polysilicon], amorphous silicon, monocrystalline silicon, or the like) is formed in a region surrounded by the sidewall SW.

Furthermore, the floating diffusion portion FD in which ions as donors are diffused is formed below the extraction electrode CPS and below the region surrounded by the sidewall SW.

In this configuration, the extraction electrode CPS can be formed by self-alignment, and therefore, it is possible to reduce a distance between the transfer gates TG without considering a margin for alignment.

Furthermore, after the extraction electrode CPS is formed (deposited) of N+ Poly Si, ions as donors are diffused (doped) from the extraction electrode CPS to the substrate SUB (e.g., silicon substrate), thereby forming the floating diffusion portion FD as an N+ diffusion layer having a small mean projected range Rp.

Therefore, the floating diffusion portion FD is formed immediately below the extraction electrode CPS.

According to this method, it is possible to form the floating diffusion portion FD having a small area that cannot be formed by patterning using a normal mask. In addition, even when the mean projected range Rp is small, ion implantation can be readily controlled, and therefore, and the ions as donors can be implanted at a depth corresponding to a desired mean projected range Rp.

Furthermore, when viewed from above the contact surface CS formed on the upper surface of the extraction electrode CPS, the extraction electrode CPS has a structure to overlap the transfer gates TG, a parasitic capacitance between the floating diffusion portion FD and the transfer gates TG increases, contributing to further boost the floating diffusion portion FD, improving transfer performance.

In addition, a distance between the transfer gate TG and the extraction electrode CPS, that is, a distance between the transfer gate IG and the extraction electrode CPS via the sidewall made of the insulating material is short, and therefore, a capacitance between the transfer gate TG and the extraction electrode CPS can be increased, the floating diffusion portion FD can be effectively boosted while achieving high conversion efficiency due to the reduction in the area of the floating diffusion portion FD, and the decrease in the transfer performance can be suppressed.

Now, a method of manufacturing the image sensor according to the first embodiment will be described.

Figure 4:
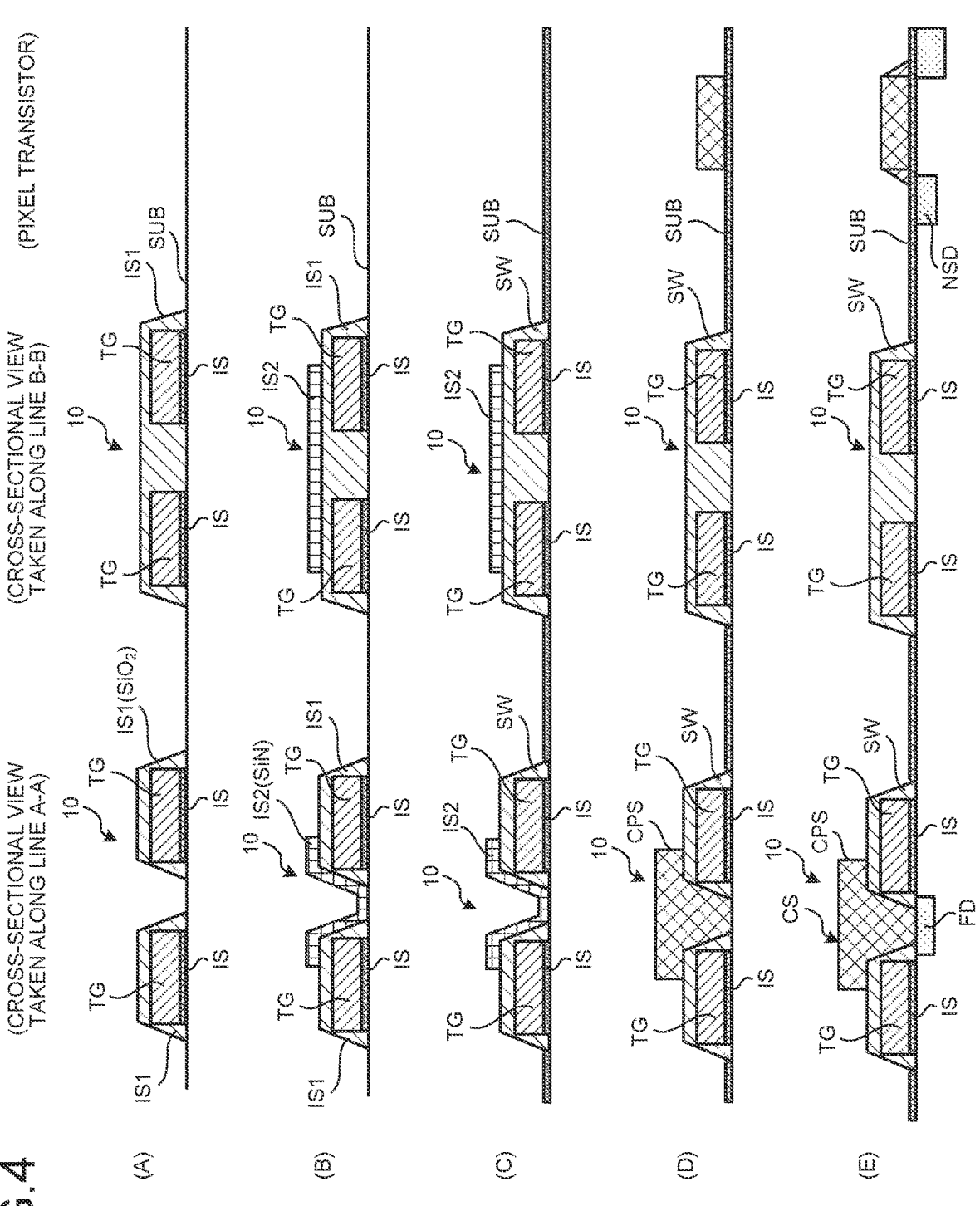
FIG. 4 illustrates diagrams of an overview of a method of manufacturing a solid state image sensor according to the first embodiment.

FIG. 4 illustrates diagrams of an overview of the method of manufacturing the solid state image sensor according to the first embodiment.

First, as illustrated in FIG. 4(A), oxidation of a region where each transfer gate TG is formed is performed to form the film of insulating material of SiO2.

Subsequently, chemical vapor deposition (CVD) of Poly Si for forming the transfer gate TG is performed, and further, SiO2 as the film of insulating material covering the transfer gate TG is formed by a CVD method.

Then, an opening is formed leaving portions corresponding to the transfer gates TG, and etching is performed by a reactive ion etching (RIE) method.

Furthermore, oxidation treatment is performed.

Subsequently, in order to form the sidewall SW, SiO2 as the film of insulating material is deposited by CVD, and etched by a reactive ion etching method so that the sidewall SW has a predetermined shape.

Accordingly, a state as illustrated in FIG. 4(A) is obtained.

Next, a second film of insulating material is formed by CVD, by using a second insulating material (In the present example, SiN) that can be etched selectively with respect to the insulating material (In the above example, SiO2) constituting the sidewall SW.

Then, the second film IS2 of insulating material that functions as a mask upon forming an oxide film is formed by wet etching.

Next, second oxidation treatment is performed to form a third film IS3 of insulating material.

Then, a portion corresponding to the second film IS2 of insulating material is opened, and the second film insulating material is removed by the wet etching method.

Subsequently, a film of conductive material of N+ Poly Si is formed by the CVD method.

Then, portions corresponding to the extraction electrode CPS and a gate terminal of the pixel transistor are opened and etched by the reactive ion etching method to form the extraction electrode CPS.

Next, SiO2 as the film of insulating material for forming the sidewall SW of the gate terminal of the pixel transistor is deposited by CVD, and etched by the reactive ion etching method so that the sidewall SW has a predetermined shape.

Subsequently, oxidation treatment is performed, and ion implantation is performed by thermal diffusion, for a region where the floating diffusion portion FD is formed and an N-type ion implantation region NSD of the pixel transistor to form the N+ diffusion layer, and the process is finished.

Note that, it is also possible to perform N+ ion injection (ion implantation, ion doping) before depositing Poly Si, instead of forming the floating diffusion portion FD by forming the N+ diffusion layer of Poly Si.

Accordingly, the solid state image sensor of the first embodiment is formed.

As described above, according to the solid state image sensor of the first embodiment, the extraction electrode CPS is formed by self-alignment in a region of the opening defined by the sidewall SW being the film of insulating material, and therefore, the distance between the transfer gate TG and the extraction electrode CPS can be reduced without being restricted in alignment. It is also possible no physically form the extraction electrode CPS as an opening of approximately 0.1 μm.

Accordingly, the distance between the transfer gate TG and the extraction electrode CPS can be reduced compared to the conventional distance, increasing the parasitic capacitance between the transfer gate TG and the extraction electrode CPS, for efficient boosting of the floating diffusion portion FD. Thus, the transfer performance can be improved.

[2] Second Embodiment

Figure 5:
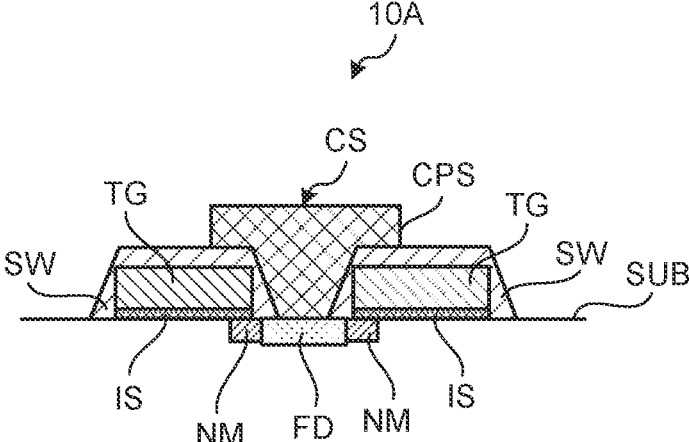
FIG. 5 is a cross-sectional view of a solid state image sensor according to a second embodiment.

FIG. 5 is a cross-sectional view of a solid state image sensor according to a second embodiment.

In FIG. 5, portions similar to those of the first embodiment illustrated in FIG. 3 are denoted by the same reference numerals.

The solid state image sensor 10A of the second embodiment is different from the solid state image sensor 10 of the first embodiment in that the number of ions (N+) as donors decreases due to the reduction of the area of the floating diffusion portion FE and an N− diffusion region NM is provided around the floating diffusion portion FD to compensate for the reduction of the number of ions.

As illustrated in FIG. 4(A), the N− diffusion region NM is formed after etching by the reactive ion etching method performed when forming the transfer gate TG or by implanting (ion injection) ions serving as acceptors in the vicinity of the surface after forming the sidewall.

Therefore, according to the present second embodiment, the area of a floating diffusion region can be reduced while further improving the function of the floating diffusion portion FD, and eventually, integration density is improved.

Other effects are similar to those of the first embodiment.

[3] Third Embodiment

Figure 6:
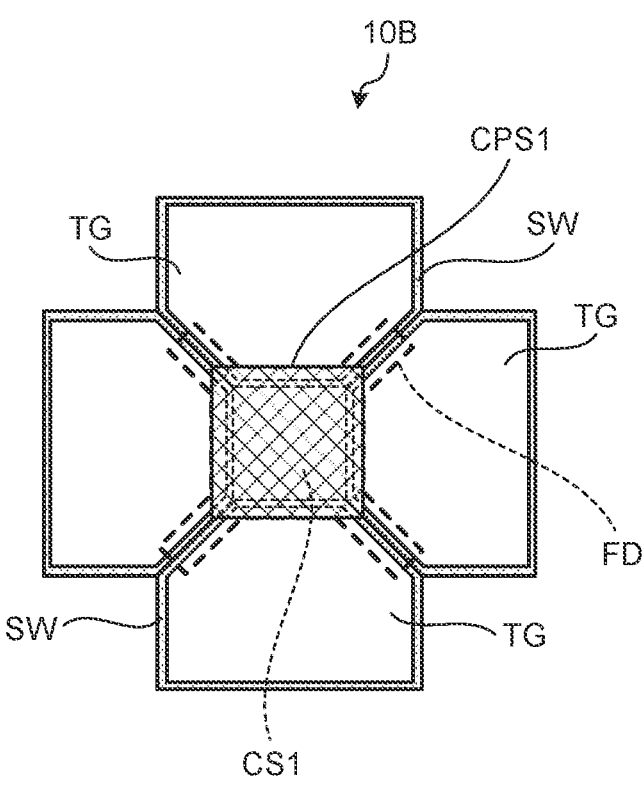
FIG. 6 is a plan view of a solid state image sensor according to a third embodiment.

FIG. 6 is a plan view of a solid state image sensor according to a third embodiment.

In FIG. 6, portions similar to those of the first embodiment illustrated in FIG. 3 are denoted by the same reference numerals.

A solid state image sensor 10B of the present third embodiment is different from the solid state image sensor 10 of the first embodiment in that an overlapping region between the transfer gate TG and the floating diffusion portion FD is increased in plan view, as illustrated in FIG. 6, instead of providing the extraction electrode CPS.

Therefore, the parasitic capacitance between the floating diffusion portion FD and the transfer gate TG increases, contributing to further boost the floating diffusion portion FD, improving the transfer performance.

Other effects are similar to those of the first embodiment.

[4] Fourth Embodiment

Figure 7:
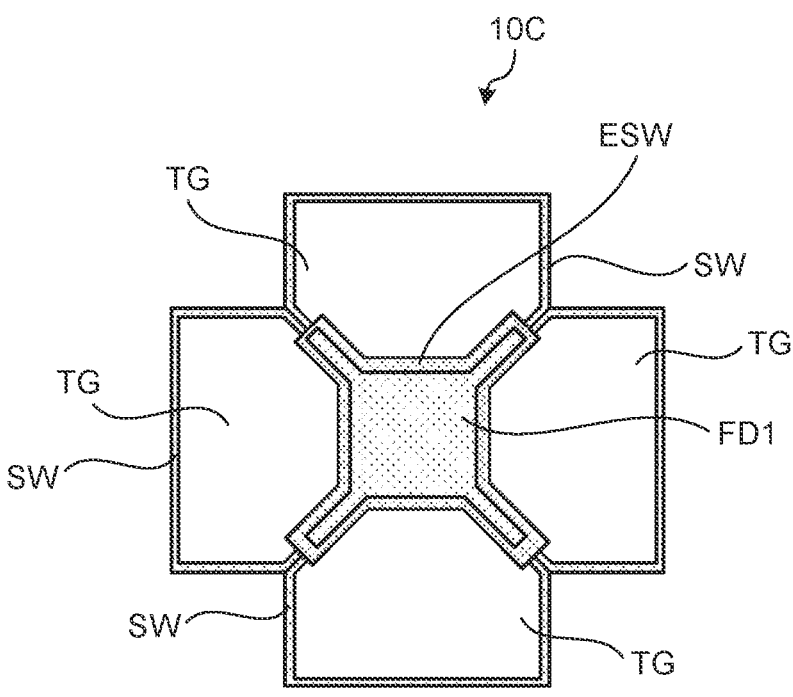
FIG. 7 is a cross-sectional view of a solid state image sensor according to a fourth embodiment.

FIG. 7 is a cross-sectional view of a solid state image sensor according to a fourth embodiment.

In FIG. 7, portions similar to those of the first embodiment illustrated in FIG. 2 are denoted by the same reference numerals.

Note that in FIG. 7, for easy understanding, the extraction electrode CPS is not illustrated.

The solid state image sensor 10C of the fourth embodiment is different from the solid state image sensor 10 of the first embodiment in that in order to suppress the reduction in an effective width of a portion of each transfer gate TG making contact with the floating diffusion portion FD due to the reduction in the area of the floating diffusion portion FD, a distance between a transfer gate TG and an adjacent transfer gate TG is increased near the floating diffusion portion FD to form a sidewall extension portion ESW by extending the sidewall SW as the film of insulating material. Note that, in FIG. 7, the sidewall SW and the sidewall extension portion ESW are illustrated separately for easy understanding, and are actually integrally formed of the same material.

Therefore, an interval between the transfer gates TG effectively adjacent to each other is partially increased to form a region in which a space between the transfer gate TG and the transfer gate TG is prevented from not being buried with the insulating film, N+ Poly Si is applied to the region, forming a protruding region of the floating diffusion portion FD.

Accordingly, according to the present fourth embodiment, the width of the floating diffusion portion FD opposed to each photodetector PD via the transfer gate TG can be increased, and the effective gate width (the width of a channel formed in silicon) contributing to transfer can be increased. Therefore, current can be readily drawn, and the transfer performance can be improved.

In this configuration as well, the periphery of the floating diffusion portion FD is surrounded by the film of insulating material as well.

Therefore, the extraction electrode CPS is allowed to be formed by self-alignment in a region of an opening defined by the sidewall SW and the sidewall extension portions ESW.

Other effects are similar to those of the first embodiment.

[5] Fifth Embodiment

Figure 8:
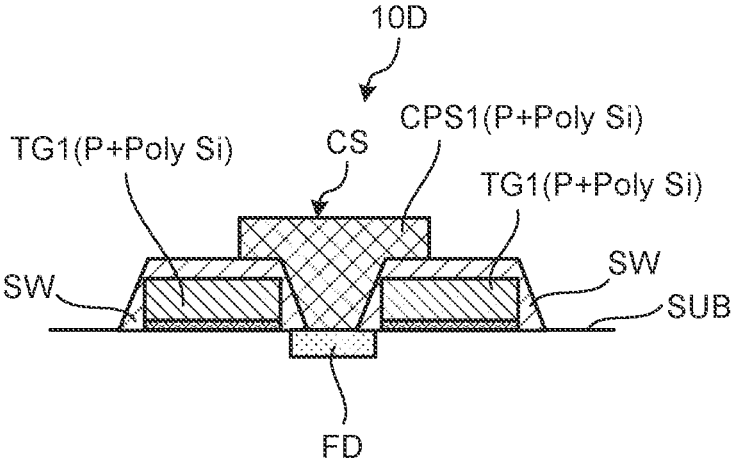
FIG. 8 is a cross-sectional view of a solid state image sensor according to a fifth embodiment.

FIG. 8 is a cross-sectional view of a solid state image sensor according to a fifth embodiment.

In FIG. 8, portions similar to those of the first embodiment illustrated in FIG. 3 are denoted by the same reference numerals.

The solid state image sensor 10D of the fifth embodiment is different from the solid state image sensor 10 of the first embodiment in that a transfer gate TG is formed of P+ Poly Si being a film of conductive material, and an extraction electrode CPS1 is formed of N++ Poly Si being a film of conductive material.

According to the present fifth embodiment, Fermi level pinning in a bandgap under the transfer gate TG can be enhanced, and imaging can be performed more stably with high accuracy.

Other effects are similar to those of the first embodiment.

[6] Sixth Embodiment

Figure 9:
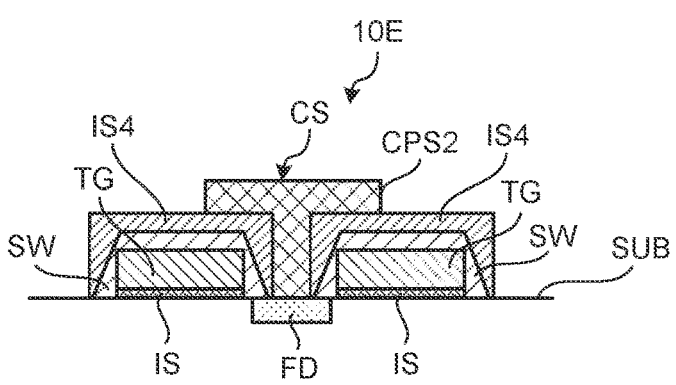
FIG. 9 is a cross-sectional view of a solid state image sensor according to a sixth embodiment.

FIG. 9 is a cross-sectional view of a solid state image sensor according to a sixth embodiment.

In FIG. 9, portions similar to those of the first embodiment illustrated in FIG. 3 are denoted by the same reference numerals.

The solid state image sensor 10E of the sixth embodiment is different from the solid state image sensor 10 of the first embodiment in that a film IS4 of insulating material that further covers the sidewall SW formed as an SiO2 film being a film of insulating material provided, and an extraction electrode CPS2 is formed in a region surrounded by the film IS4 of insulating material.

In other words, according to the present sixth embodiment, the extraction electrode CPS2 electrically connected to the floating diffusion portion FD is formed similarly to that of the first embodiment.

However, the transfer gate TG and the extraction electrode CPS2 are different in that the transfer gate TG and the extraction electrode CPS2 are separated by the film IS4 of insulating material instead of the sidewall SW.

In other words, the transfer gate TG and the extraction electrode CPS2 need to be separated by the film of insulating material, but do not necessarily need to be separated by the sidewall of the transfer gate TG.

Other effects are similar to those of the first embodiment.

[7] Seventh Embodiment

In the embodiments described above, one floating diffusion portion FD has been shared by four pixels, but in the present seventh embodiment, one floating diffusion portion FD is shared by two pixels.

Figure 10:
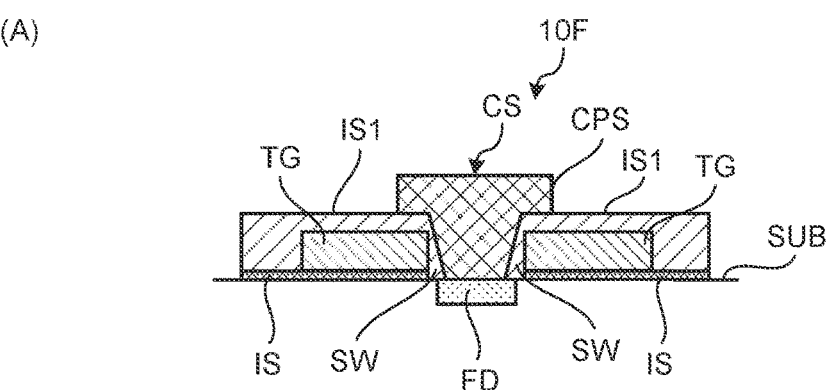
FIG. 10 illustrates diagrams of a solid state image sensor according to a seventh embodiment.
Figure 10:
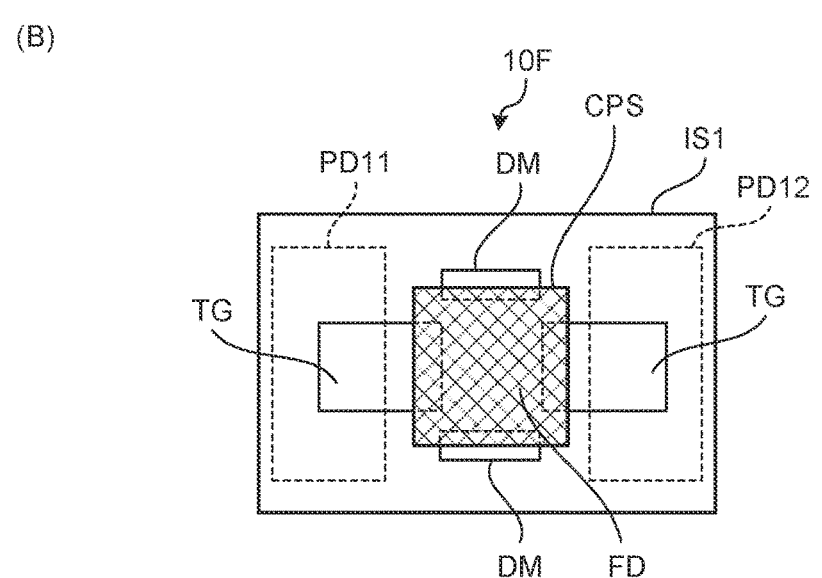

FIG. 10 illustrates diagrams of a solid state image sensor according to the seventh embodiment.

FIG. 10(A) is a cross-sectional view of the solid state image sensor of the seventh embodiment.

Furthermore, FIG. 10(B) is a plan view of the solid state image sensor of the seventh embodiment.

In FIG. 10, portions similar to those of the first embodiment illustrated in FIG. 3 are denoted by the same reference numerals.

As illustrated in FIGS. 10(A) and 10(B), in the image sensor 10F of the seventh embodiment, a pair of transfer gates TG corresponding to a pair of shared photodetector PD11 and photodetector PD12 are formed on the film IS of insulating material.

A so-called sidewall SW made of an insulating material (e.g., SiO2) is formed on the peripheral surfaces of each transfer gate TG, and a film IS1 of insulating material made of the same material as that of the sidewall SW is also formed on the upper surface of each transfer gate TG.

Furthermore, the extraction electrode CPS made of a film of conductive material (e.g., N+ Poly Si [N-type polysilicon], amorphous silicon, monocrystalline silicon, or the like) is formed in a region surrounded by the sidewall SW.

Furthermore, the floating diffusion portion FD in which ions as donors are diffused is formed below the extraction electrode CPS and below the region surrounded by the sidewall SW.

In this configuration as well as, as in the first embodiment, the extraction electrode CPS can be formed by self-alignment, and therefore, it is possible to reduce the distance between the transfer gates TG without considering the margin for alignment.

Furthermore, after the extraction electrode CPS is formed (deposited) of N+ Poly Si, ions as donors are diffused (doped) from the extraction electrode CPS to the substrate SUB (e.g., silicon substrate), thereby forming the floating diffusion portion FD as an N+ diffusion layer having a small mean projected range Rp. Therefore, the floating diffusion portion FD is formed immediately below the extraction electrode CPS.

Therefore, in the present seventh embodiment as well, as in the first embodiment, the extraction electrode CPS is formed by self-alignment in the region of the opening defined by the sidewall SW being the film of insulating material, and therefore, the distance between the transfer gate TG and the extraction electrode CPS can be reduced without being restricted in alignment. It is also possible to physically form the extraction electrode CPS as an opening of approximately 0.1 μm.

Accordingly, according to the present seventh embodiment, the distance between the transfer gate TG and the extraction electrode CPS is also reduced, and therefore, the parasitic capacitance between the floating diffusion portion FD and the transfer gate TG increases, contributing to further boost the floating diffusion portion FD, improving the transfer performance.

[8] Eighth Embodiment

In the embodiments described above, one floating diffusion portion FD has been shared by a plurality of pixels, but in the present eighth embodiment, one floating diffusion portion FD is used by one pixel.

Figure 11:
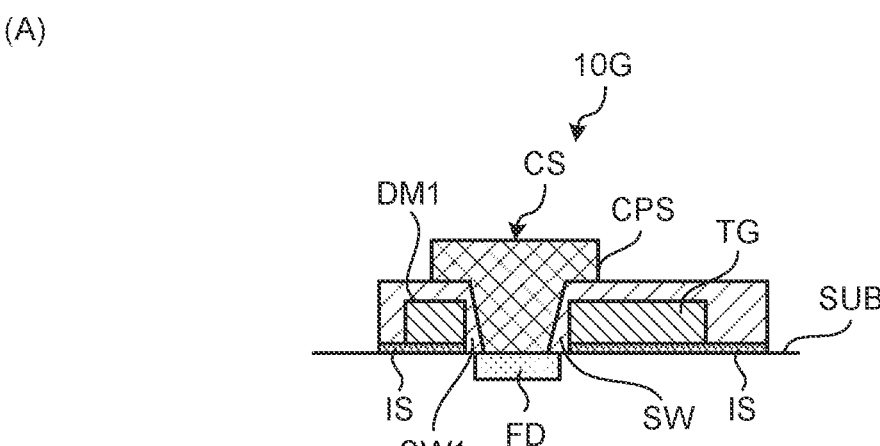
FIG. 11 illustrates diagrams of a solid state image sensor according to an eighth embodiment.
Figure 11:
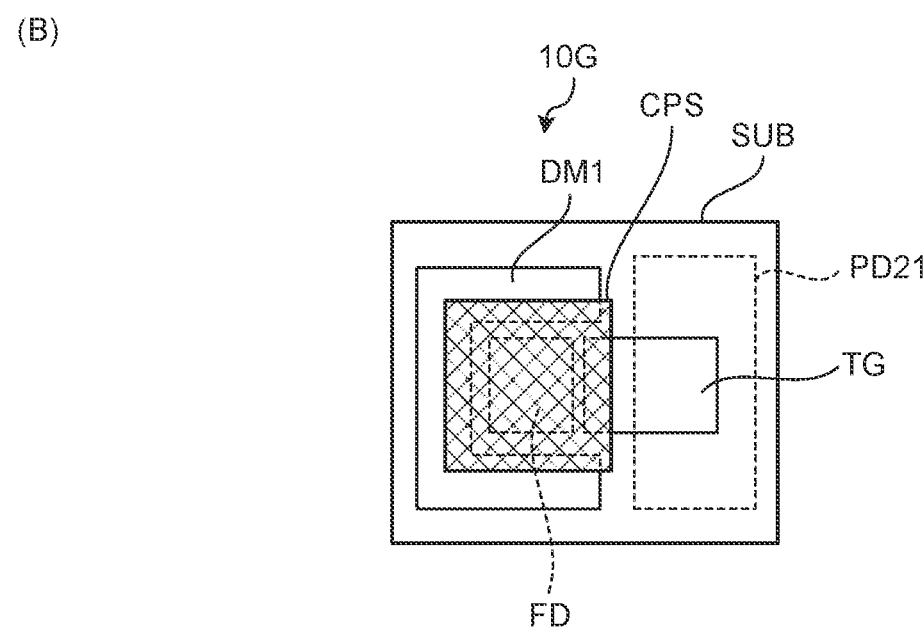

FIG. 11 illustrates diagrams of a solid state image sensor according to the eighth embodiment.

FIG. 11(A) is a cross-sectional view of the solid state image sensor of the eighth embodiment.

Furthermore, FIG. 11(B) is a plan view of the solid state image sensor of the eighth embodiment.

In FIG. 11, portions similar to those of the first embodiment illustrated in FIG. 3 are denoted by the same reference numerals.

Unlike the embodiments described above, in the image sensor 10G of the eighth embodiment, the transfer gate TG has no opposed transfer gate TG.

Therefore, in order to surround the periphery of the region for forming the extraction electrode CPS with the film of insulating material, a dummy electrode DM1 having a C-shape in plan view and formed of, for example, Poly Si (the same material as that of the transfer gate TG) is formed at a position opposed to the transfer gate TG.

Accordingly, surrounding the upper side from the floating diffusion portion FD by the sidewall SW of the transfer gate TG and a sidewall SW1 of the dummy electrode DM1 makes it possible to constitute a region for forming the extraction electrode CPS.

Therefore, according to the present eighth embodiment, as in the first embodiment, the extraction electrode CPS is allowed to be formed by self-alignment in the region of the opening defined by the sidewall SW being the film of insulating material and the sidewall SW1, and therefore, the distance between the transfer gate TG and the extraction electrode CPS can be reduced without being restricted in alignment.

Other effects are similar to those of the first embodiment.

[9] Ninth Embodiment

In the eighth embodiment described above, when one floating diffusion portion FD is used by one pixel, the dummy electrode is used to surround the periphery of the region for forming the extraction electrode CPS with the film of insulating material. However, in the present ninth embodiment, the periphery of the region for forming the extraction electrode CPS is surrounded by the film IS1 of insulating material covering the upper surface of the transfer gate TG and with the sidewall SW of the transfer gate TG.

Figure 12:
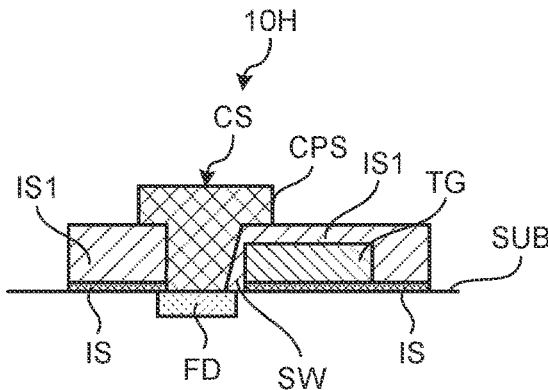
FIG. 12 illustrates diagrams of a solid state image sensor according to a ninth embodiment.
Figure 12:
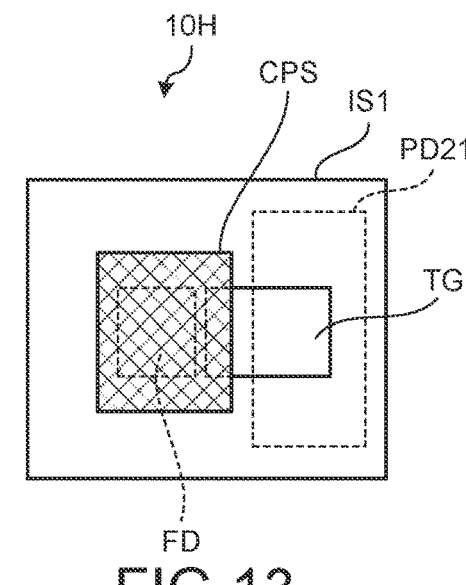

FIG. 12 illustrates diagrams of a solid state image sensor according to the ninth embodiment.

FIG. 12(A) is a cross-sectional view of the solid state image sensor of the ninth embodiment.

FIG. 12(B) is a plan view of the solid state image sensor of the ninth embodiment.

As in the eighth embodiment, in the image sensor 10H of the ninth embodiment, the transfer gate TG has no opposed transfer gate TG.

Therefore, in order to surround the periphery of the region for forming the extraction electrode CPS with the film of insulating material, the film IS1 of insulating material formed of SiO2 is left at a position opposed to the transfer gate TG.

Accordingly, surrounding the upper side from the floating diffusion portion FD by the sidewall SW of the transfer gate TG and the film IS1 of insulating material makes it possible to constitute the region for forming the extraction electrode CPS.

Therefore, according to the present ninth embodiment, as in the eighth embodiment, the extraction electrode CPS is allowed to be formed by self-alignment in the region of the opening defined by the sidewall SW being the film of insulating material and the film IS1 of insulating material, and therefore, the distance between the transfer gate TG and the extraction electrode CPS can be reduced without being restricted in alignment.

Other effects are similar to those of the first embodiment.

[10] Tenth Embodiment

In the embodiments described above, the transfer gate TG has a rectangular shape, but in the present tenth embodiment, the transfer gate TG is formed as a transfer gate TG1 having an L-shape in plan view in order to arrange the transfer gate TG at a corner portion of a corresponding rectangular photodetector.

Figure 13:
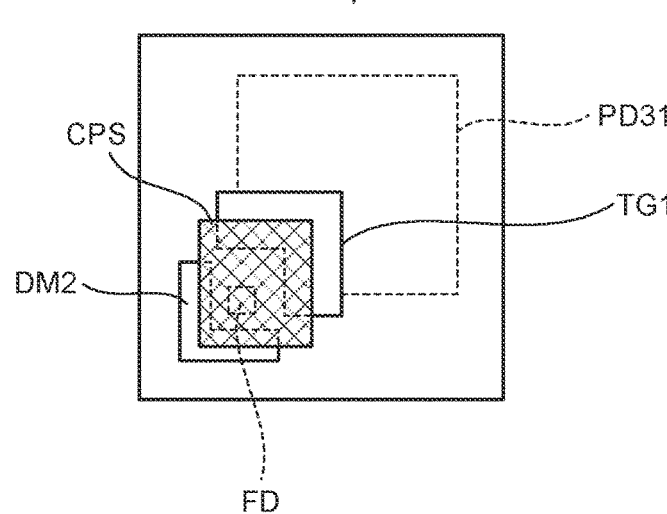
FIG. 13 is a plan view of a solid state image sensor according to a tenth embodiment.

FIG. 13 is a plan view of the solid state image sensor according to the tenth embodiment.

In FIG. 13, portions similar to those of the eighth embodiment in FIG. 11 are denoted by the same reference numerals.

In the solid state image sensor 10I of the present tenth embodiment as well, as in the eighth embodiment, the transfer gate TG has no opposed transfer gate TG.

Therefore, in order to surround the periphery of the region for forming the extraction electrode CPS with the film of insulating material, a dummy electrode DM2 formed of, for example, Poly Si and having an L-shape in plan view is formed at a position opposed to the transfer gate TG.

Accordingly, surrounding the upper side from the floating diffusion portion FD by the sidewall SW of the transfer gate TG and the sidewall SW1 of the dummy electrode DM2 makes it possible to constitute the region for forming the extraction electrode CPS.

Therefore, according to the present tenth embodiment, as in the first embodiment, the extraction electrode CPS is allowed to be formed by self-alignment in the region of the opening defined by the sidewall SW being the film of insulating material and the sidewall, and therefore, the distance between the transfer gate TG and the extraction electrode CPS can be reduced without being restricted in alignment.

Other effects are similar to those of the eighth embodiment.

[11] Eleventh Embodiment

In the present eleventh embodiment, the transfer gate TG1 has a U-shape in plan view.

Figure 14:
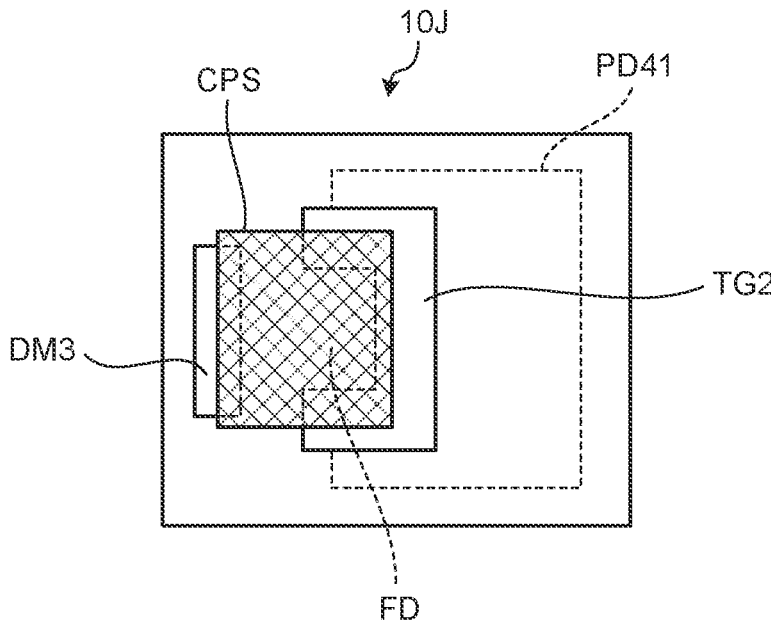
FIG. 14 is a plan view of a solid state image sensor according to an eleventh embodiment.

FIG. 14 is a plan view of a solid state image sensor according to the eleventh embodiment.

In FIG. 14, portions similar to those of the eighth embodiment in FIG. 11 are denoted by the same reference numerals.

In the solid state image sensor 10J of the present eleventh embodiment as well, as in the eighth embodiment, the transfer gate TG has no opposed transfer gate TG.

Therefore, in order to surround the periphery of the region for forming the extraction electrode CPS corresponding to a photodetector PD41 with the film of insulating material, a dummy electrode DM3 formed of, for example, Poly Si and having an I-shape in plan view is formed at a position opposed to the transfer gate TG2 having a U-shape in plan view.

Accordingly, surrounding the upper side from the floating diffusion portion FD by a sidewall SW of the transfer gate TG2 and a sidewall of the dummy electrode DM3 makes it possible to constitute the region for forming the extraction electrode CPS.

Therefore, according to the present eleventh embodiment as well, as in the first embodiment, the extraction electrode CPS is allowed to be formed by self-alignment in the region of the opening defined by the sidewall SW being the film of insulating material and the sidewall, and therefore, the distance between the transfer gate TG2 and the extraction electrode CPS can be reduced without being restricted in alignment.

Other effects are similar to those of the eighth embodiment.

[12] Twelfth Embodiment

In the present eleventh embodiment, the transfer gate TG1 has a U-shape in plan view.

Figure 15:
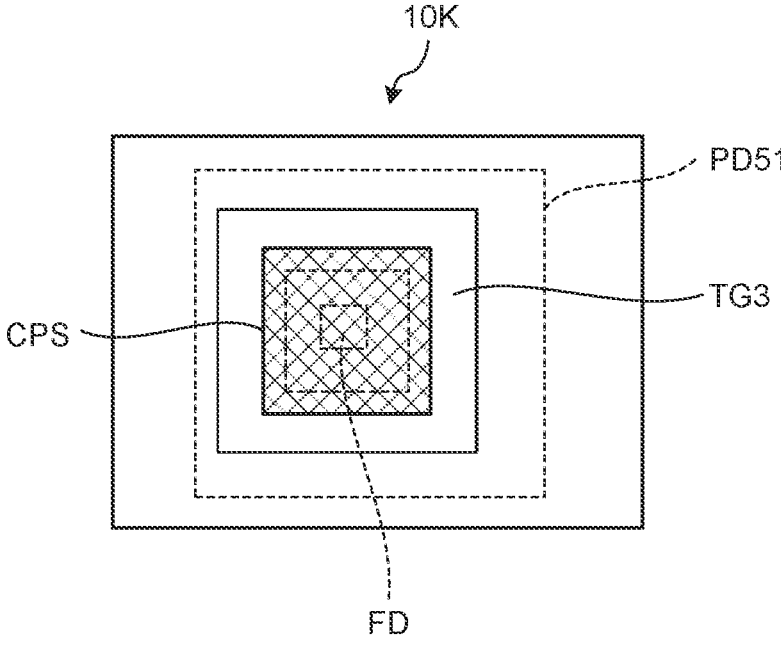
FIG. 15 is a plan view of a solid state image sensor according to a twelfth embodiment.

FIG. 15 is a plan view of a solid state image sensor according to the twelfth embodiment.

In FIG. 15, portions similar to those of the eighth embodiment in FIG. 11 are denoted by the same reference numerals.

In the solid state image sensor 10K of the present twelfth embodiment as well, as in the eighth embodiment, a transfer gate TG3 has no opposed transfer gate TG.

However, the transfer gate TG3 itself has a shape surrounding the region for forming the extraction electrode CPS corresponding to a photodetector PD51, and therefore, surrounding the upper side from the floating diffusion portion FD with the sidewall of the transfer gate TG3 makes it possible to constitute the region for forming the extraction electrode CPS.

Therefore, according to the present twelfth embodiment as well, as in the first embodiment, the extraction electrode CPS is allowed to be formed by self-alignment in the region of the opening defined by the sidewall of the transfer gate TG3 being the film of insulating material, and therefore, the distance between the transfer gate TG3 and the extraction electrode CPS can be reduced without being restricted in alignment.

Other effects are similar to those of the eighth embodiment.

[13] Thirteenth Embodiment

In the embodiments described above, the extraction electrode CPS electrically connected to the floating diffusion portion FD corresponding to the transfer gate TG has been provided, but in the present thirteenth embodiment, the extraction electrode CPS electrically connected to the floating diffusion portion FD corresponding to the transfer gate TG is provided and wiring is connected to the floating diffusion portion FD corresponding to the reset transistor TR2.

Figure 16:
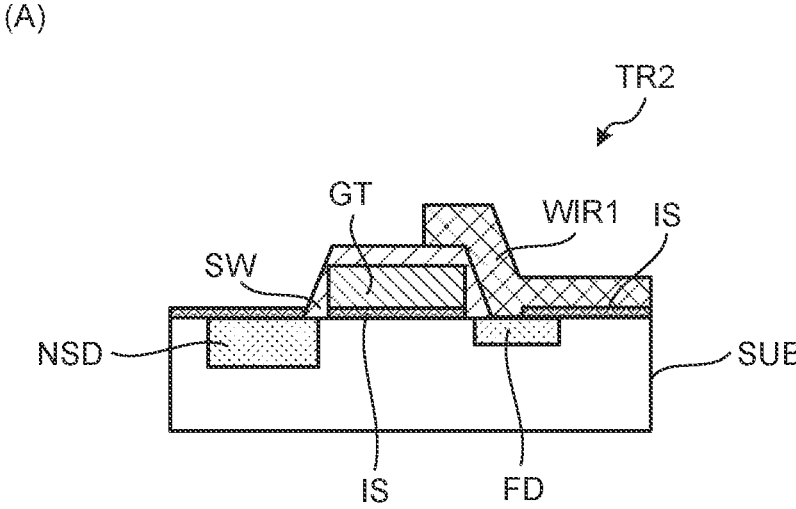
FIG. 16 illustrates diagrams of a thirteenth embodiment.
Figure 16:
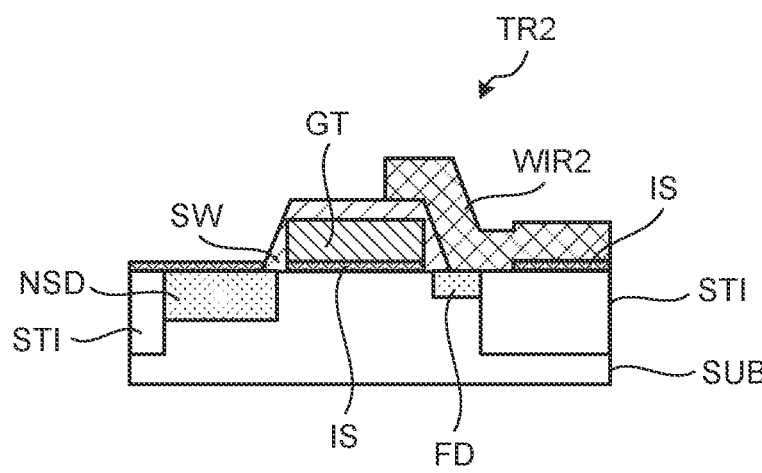

FIG. 16 illustrates diagrams of the thirteenth embodiment.

FIG. 16(A) is a cross-sectional view of the reset transistor using junction isolation.

FIG. 16(B) is a cross-sectional view of the reset transistor using shallow trench isolation (STI).

Figure 17:
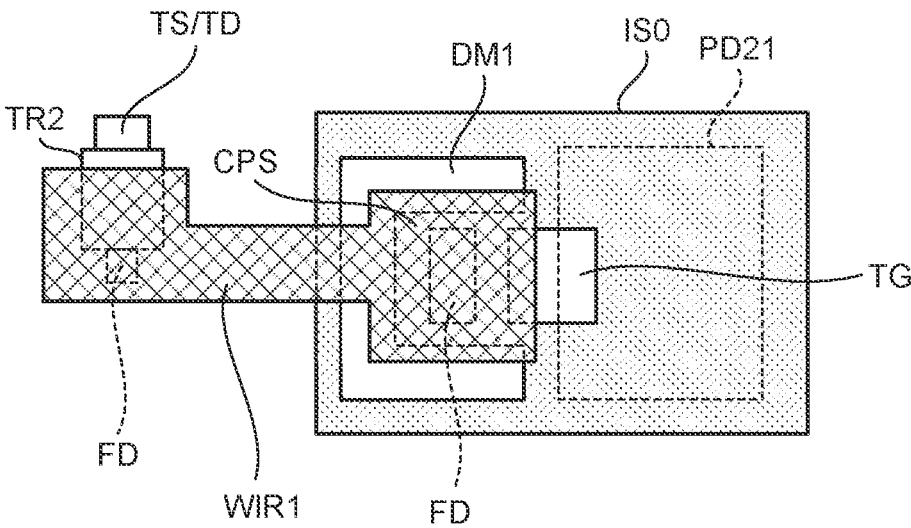
FIG. 17 is a plan view of the thirteenth embodiment.

Furthermore, FIG. 17 is a plan view of the thirteenth embodiment.

As illustrated in FIG. 16(A), when the junction isolation is performed, for example, the floating diffusion portion FD converts a charge of a gate control signal input via the metal wiring WIR formed of Poly Si as the conductive material into a voltage signal, and applies the voltage signal to a gate terminal GT to drive the reset transistor TR2.

As illustrated in FIG. 17, the extraction electrode CPS is electrically connected to the reset transistor TR2 and the floating diffusion portion FD corresponding to a photodetector PD21, and the electrical connection of the extraction electrode CPS is achieved via metal wiring WIR1.

Furthermore, as illustrated in FIG. 16(B), even when shallow trench isolation (STI) separation is performed, an impurity-thermally-diffused region NSD for constituting the source/drain and the floating diffusion portion FD are separated from the surrounding region by the STI, and, for example, the floating diffusion portion FD converts the charge of the gate control signal input via the metal wiring WIR1 formed of Poly Si as the conductive material into the voltage signal, and applies the voltage signal to the gate terminal GT to drive the reset transistor TR2.

Now, a method of manufacturing the image sensor according to the thirteenth embodiment will be described.

Figure 18:
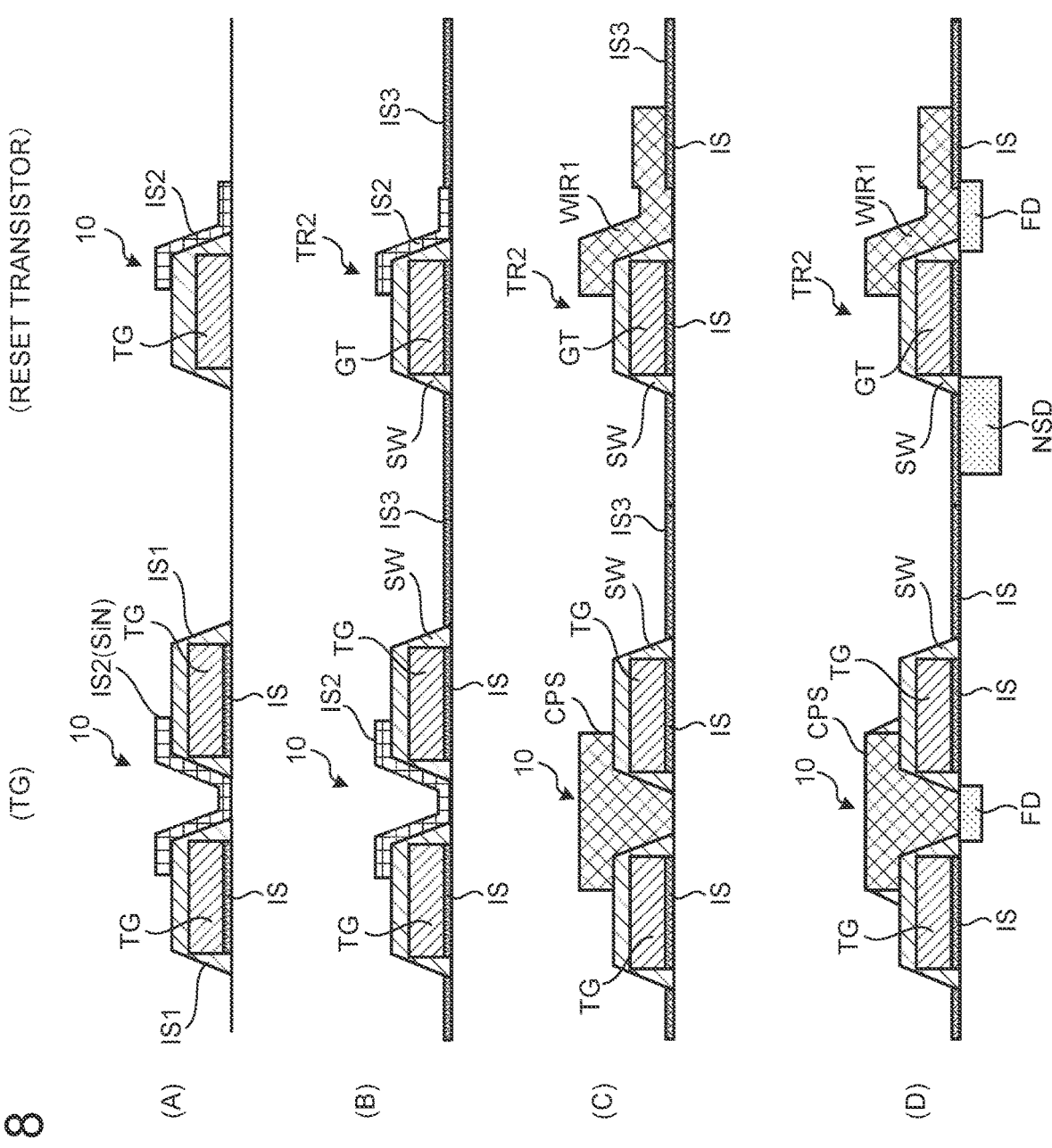
FIG. 18 illustrates diagrams of an overview of a method of manufacturing a solid state image sensor according to the thirteenth embodiment.

FIG. 18 illustrates diagrams of an overview of the method of manufacturing the solid state image sensor according to the thirteenth embodiment.

First, as illustrated in FIG. 18(A), oxidation of the region where the transfer gate TG and the gate GT are formed is performed to form the film of insulating material of SiO2. Subsequently, chemical vapor deposition (CVD) of Poly Si for forming the transfer gate TG and the gate GT is performed, and further, SiO2 as the film of insulating material covering the transfer gate TG and the gate GT is formed by a CVD method.

Then, an opening is formed leaving portions corresponding to the transfer gate TG and the gate GT, and etching is performed by a reactive ion etching (RIE) method.

Furthermore, oxidation treatment is performed.

Subsequently, in order to form the sidewall SW, SiO2 as the film of insulating material is deposited by CVD, and etched by a reactive ion etching method so that the sidewall SW has a predetermined shape.

Next, a second film of insulating material is formed by CVD, by using a second insulating material (In the present example, SiN that can be etched selectively with respect to the insulating material (In the above example, SiO2) constituting the sidewall SW.

Then, the second film IS2 of insulating material that functions as a mask upon forming an oxide film is formed by wet etching.

Accordingly, a state as illustrated in FIG. 18(A) is obtained.

Next, second oxidation treatment is performed to form a third film IS3 of insulating material.

Accordingly, a state as illustrated in FIG. 18(B) is obtained.

Then, a portion corresponding to the second film IS2 of insulating material is opened, and the second film insulating material is removed by the wet etching method.

Subsequently, a film of conductive material of N+ Poly Si is formed by the CVD method.

Then, portions corresponding to the extraction electrode CPS and the gate terminal of the pixel transistor are opened and etched by a reactive ion etching method to form the extraction electrode CPS and the metal wiring WIR1.

Accordingly, a state as illustrated in FIG. 18(C) is obtained.

Next, SiO2 as the film of insulating material for forming the sidewall SW of the gate terminal of the pixel transistor is deposited by CVD, and etched by the reactive ion etching method so that the sidewall SW has a predetermined shape.

Subsequently, oxidation treatment is performed, and ion implantation is performed by thermal diffusion, for a region where the floating diffusion portion FD is formed and the N-type ion implantation region NSD of the reset transistor TR2 to form the N+ diffusion layer, and the process is finished.

Note that, it is also possible to perform N+ ion injection (ion implantation, ion doping) before depositing Poly Si, instead of forming the floating diffusion portion FD by forming the N+ diffusion layer of Poly Si.

Accordingly, the solid state image sensor of the thirteenth embodiment is formed.

As described above, according to the solid state image sensor of the thirteenth embodiment, the extraction electrode CPS is formed by self-alignment in a region of the opening defined by the sidewall SW being the film of insulating material, and therefore, the distance between the transfer gate TG and the extraction electrode CPS can be reduced without being restricted in alignment.

Furthermore, in parallel, the wiring WIR1, the floating diffusion portion FD, and the N-type ion implantation region NSD can be formed in the gate GT of the reset transistor TR2.

In the above description, the wiring with the source terminal of the reset transistor TR2 is formed by the floating diffusion portion formed by diffusing an N-type dopant via the extraction electrode after the extraction electrode is formed. However, it is also possible for the amplification transistor TR3 to have a configuration that the wiring for the gate terminal of the amplification transistor TR3 is formed by the same film of conductive material as that of the film of conductive material forming the extraction electrode by a similar method, in parallel with the process of forming the extraction electrode.

Accordingly, the distance between the transfer gate TG and the extraction electrode CPS is also reduced by a simple procedure, and therefore, the parasitic capacitance between the floating diffusion portion FD and the transfer gate TG increases, contributing to further boost the floating diffusion portion FD, improving the transfer performance.

[14] Effects of Embodiments

As described above, according to the present embodiment, it is possible to form the floating diffusion portion FD having such a small area in which the contact cannot be formed due to a problem of alignment, and it is possible to form the floating diffusion portion FD that can be miniaturized. Then, formation of the floating diffusion portion FD having a small area enables achievement of high conversion efficiency.

In addition, the extraction electrode CPS (e.g., Poly Si) electrically connected to the floating diffusion portion FD overlaps the transfer gate TG, and therefore, the floating diffusion portion FD can be effectively boosted, and signal reading can be performed with high accuracy.

In addition, N+ Poly Si is used as Poly Si forming the extraction electrode CPS electrically connected to the transfer gate TG and the floating diffusion portion FD, P+ Poly Si is used as Poly Si forming the transfer gate TG, and therefore, it is possible to enhance the Fermi level pinning in the band gap under the transfer gate TG.

[5] Modifications of Embodiments

Note that the embodiments of the present technology are not limited to the embodiments described above, and various modifications and alterations can be made without departing from the sprit and scope of the present technology.

In the above description, Poly Si is used as the conductive material, but the conductive material is not limited thereto.

Similarly, the insulating material employs SiO2 and SiN, but is not limited thereto as long as the insulating material have a combination of the insulating materials that can be selectively etched in manufacturing.

Furthermore, the present technology can have the following configurations.

(1)
A solid state image sensor comprising:
a transfer gate;
a floating diffusion portion that converts signal charge transferred from a photodiode via the transfer gate into a voltage signal; and
an extraction electrode that is formed of a film of conductive material including any of N-type polysilicon, amorphous silicon, or monocrystalline silicon, that has a peripheral edge portion surrounded by a film of insulating material and one end electrically connected to the floating diffusion portion, and that transmits the voltage signal.

(2)
The solid state image sensor according to (1), wherein the floating diffusion port ion includes an N+ semiconductor, and
an N− semiconductor region is provided around the floating diffusion portion.

(3)
The solid state image sensor according to (1) or (2), wherein
the extraction electrode overlaps the transfer gate in order that an area of the extraction electrode is larger than an area of a region surrounded by the film of insulating material, in plan view of the solid state image sensor is viewed.

14

(4)
The solid state image sensor according to any one of (1) to (3), wherein
the transfer gate is formed of P+ polysilicon.

(5)
The solid state image sensor according to any one of (1) to (4), wherein
the extraction electrode is shared by a plurality of pixels.

(6)
The solid state image sensor according to (5), wherein
a distance between the transfer gates adjacent to each other via a film of insulating material is increased, and the extraction electrode is formed also between the transfer gates opposed to each other.

(7)
The solid state image sensor according to any one of (1) to (6), wherein
in plan view of the solid state image sensor, when another transfer gate is not located at a position opposed to the transfer gate via the floating diffusion portion, a dummy electrode is arranged at the position, and a film of insulating material covering a sidewall of the dummy electrode is formed as part of the film of insulating material surrounding the extraction electrode.

(8)
The solid state image sensor according to (7), wherein
the transfer gate and the dummy electrode are formed of the same film of conductive material.

(9)
The solid state image sensor according to any one of (1) to (8), wherein
in plan view of the solid state image sensor, when another transfer gate is not located at a position opposed to the transfer gate via the floating diffusion portion, a film of insulating material is formed at the position, as part of the film of insulating material surrounding the extraction electrode.

(10)
The solid state image sensor according to any one of (1) to (9), wherein
wiring with a gate terminal of an adjacent amplification transistor is formed with the same film of conductive material as the film of conductive material forming the extraction electrode.

(11)
The solid state image sensor according to any one of (1) to (10), wherein
wiring with a source terminal of an adjacent reset transistor is formed by a floating diffusion portion formed by diffusing an N-type do pant via the extraction electrode.

(12)
A method of manufacturing a solid state image sensor comprising:
forming a transfer gate covered with a first film of insulating material made of a first insulating material on a semiconductor substrate;
forming a mask with a second insulating material that can be selectively etched with respect to the first insulating material, at a predetermined connection position between an extraction electrode and a Si surface;
performing oxidation treatment in a state where the mask is formed, in order not to oxidize the planned connection position; and
selectively etching the second insulating material and removing the second insulating material;

forming a film of conductive material with a conductive material, at a predetermined position where the extraction electrode is formed, and forming the extraction electrode; and forming a floating diffusion portion by thermal diffusion, via the extraction electrode.

(13)

The method of manufacturing a solid state image sensor according to (12), wherein the solid state image sensor includes an amplification transistor, and the method comprises forming wiring for a gate terminal of the amplification transistor, with the same film of conductive material as the film of conductive material forming the extraction electrode, in parallel with the forming of the extraction electrode.

(14)

The method of manufacturing a solid state image sensor according to (12) or (13), wherein the solid state image sensor includes a reset transistor, and the method comprises forming wiring with a source terminal of the reset transistor by a floating diffusion portion formed by diffusing an N-type dopant via the extraction electrode, after forming the extraction electrode.

REFERENCE SIGNS LIST 10, 10A To 10K Solid State Image Sensor
CPS Extraction Electrode
CS Contact Surface
CPS1, CPS2 Extraction Electrode
DM1 to DM3 Dummy Electrode
ESW Sidewall Extension Portion (Sidewall SW)
FD Floating Diffusion Portion
GT Gate
IS, IS1 Film of Insulating Material
IS2 Second Film of Insulating Material
IS3 Third Film of Insulating Material
IS4 Film of Insulating Material
PD, PD1, PD11, PD12 Photodetector
PD21 Photodetector
PD41 Photodetector
PD51 Photodetector
SUB Substrate
SW, SW1 Sidewall

16

TG, TG1 to TG3 Transfer Gate
TR1 Transfer Transistor
TR2 Reset Transistor
TR3 Amplification Transistor
TR4 Selection Transistor
WIR, WIR1 Metal Wiring (Signal Wiring)

The invention claimed is:

1. A method of manufacturing a solid state image sensor comprising:

forming a transfer gate covered with a first film of insulating material made of a first insulating material on a semiconductor substrate;

forming a mask with a second insulating material that can be selectively etched with respect to the first insulating material, at a predetermined connection position between an extraction electrode and a Si surface;

performing oxidation treatment in a state where the mask is formed, in order not to oxidize the planned connection position; and selectively etching the second insulating material and removing the second insulating material;

forming a film of conductive material with a conductive material, at a predetermined position where the extraction electrode is formed, and forming the extraction electrode; and forming a floating diffusion portion by thermal diffusion, via the extraction electrode.

2. The method of manufacturing a solid state image sensor according to claim 1, wherein the solid state image sensor includes an amplification transistor, and the method comprises forming wiring for a gate terminal of the amplification transistor, with the same film of conductive material as the film of conductive material forming the extraction electrode, in parallel with the forming of the extraction electrode.

3. The method of manufacturing a solid state image sensor according to claim 1, wherein the solid state image sensor includes a reset transistor, and the method comprises forming wiring with a source terminal of the reset transistor by a floating diffusion portion formed by diffusing an N-type dopant via the extraction electrode, after forming the extraction electrode.

* * * * *